(12) United States Patent
Yamada et al.

(10) Patent No.: US 6,449,530 B1
(45) Date of Patent: Sep. 10, 2002

(54) SEMICONDUCTOR WAFER CARRIER, SEMICONDUCTOR WAFER CARRIER AUTOMATIC TRANSFER SYSTEM AND METHOD FOR PRODUCING A SEMICONDUCTOR DEVICE

(75) Inventors: Yoshiaki Yamada; Akira Ono, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 119 days.

(21) Appl. No.: 09/704,747

(22) Filed: Nov. 3, 2000

(30) Foreign Application Priority Data

Jan. 13, 2000 (JP) ........................ 2000-004443
May 30, 2000 (JP) ........................ 2000-159525

(51) Int. Cl.[7] ................................ G06F 7/00
(52) U.S. Cl. ........................ 700/214; 414/940
(58) Field of Search ................ 700/213, 214, 700/228, 95, 108, 113; 414/937, 940

(56) References Cited

U.S. PATENT DOCUMENTS 5,166,884 A * 11/1992 Maney et al. ............... 364/468
6,169,935 B1 * 1/2001 Iwasaki et al. ............. 700/214
6,218,202 B1 * 4/2001 Yew et al. .................... 438/15

FOREIGN PATENT DOCUMENTS

JP          5-109878          4/1993

* cited by examiner

Primary Examiner—Christopher P. Ellis
Assistant Examiner—Khoi H. Tran
(74) Attorney, Agent, or Firm—McDermott, Will & Emery

(57) ABSTRACT

A semiconductor wafer carrier 1 measures a transferring speed of a semiconductor wafer carrier transfer system; a result of measured speed is compared with a threshold value to obtain a result of comparison, and the result of comparison is transmitted to a semiconductor wafer carrier automatic transferring device 8 to adjust an operational parameter, whereby all constructive device elements of the semiconductor wafer carrier automatic transferring system can be automatically adjusted and a time for setting-up can be shortened as well as saving man power.

10 Claims, 7 Drawing Sheets

SEMICONDUCTOR WAFER CARRIER, SEMICONDUCTOR WAFER CARRIER AUTOMATIC TRANSFER SYSTEM AND METHOD FOR PRODUCING A SEMICONDUCTOR DEVICE

BACKGROUND OF THE INVENTION

Field of the Invention

The present invention relates to a semiconductor wafer carrier; a semiconductor wafer carrier automatic transfer system for transferring automatically the semiconductor wafer carrier, and a method for setting-up or maintaining the system.

DISCUSSION OF BACKGROUND

A conventional semiconductor wafer carrier automatic transfer system was comprised of a plurality of devices. Accordingly, when the entire system is set up, every device had to be subjecting to adjustment or setting up.

In the conventional semiconductor wafer carrier automatic transfer system including a plurality of devices, when the system was set up, it was necessary to adjust or set up the devices separately. Accordingly, a much time was required for setting them up and there was a possibility that conditions for setting-up became ununiform depending on workers and the dates of working.

Further, after the system has once been in operation, it was necessary to stop the system in order to conduct a maintenance work for assuring a stable operation of the system, whereby productivity was decreased.

Further, in the case of conducting maintenance regularly, there is a possibility that a decrease in performance is not detected until a maintenance work is conducted. In this case, operations of the system are continued in a state of reduced performance. Namely, there was a problem that a necessary adjustment could not be made at a necessary time.

SUMMARY OF THE INVENTION

It is an object of the present invention to provide a semiconductor wafer carrier automatic transfer system capable of shortening a set-up time of the system based on a diagnostic result of the system and devices and of assuring a stable operation of the system by utilizing the diagnostic result.

It is an object of the present invention to provide a semiconductor wafer carrier which measures data on an item in a semiconductor wafer carrier automatic transfer system; calculates the date to obtain a result; and feeds back the result to the system so that the system performs stable operations.

In accordance with a first aspect of the present invention, there is provided a semiconductor wafer carrier which comprises a measuring section for measuring a measurement item, a computing section having functions to calculate a result of measurement based on measured data and to compare the result with a threshold value of the measurement item, a display section for displaying a result of comparison and a result of measurement and a communicating section for conducting communication with an outer device.

According to a second aspect of the present invention, there is provided the semiconductor wafer carrier according to the first aspect, wherein the measurement item is velocity.

According to a third aspect of the present invention, there is provided the semiconductor wafer carrier according to the first aspect, wherein the measurement item is an impact value.

According to a fourth aspect of the present invention, there is provided the semiconductor wafer carrier according to the first aspect, wherein the measurement item is time.

According to a fifth aspect of the present invention, there is provided the semiconductor wafer carrier according to the first aspect, wherein the measurement item is a component of ambience.

In accordance with a sixth aspect of the present invention, there is provided a semiconductor wafer carrier automatic transfer system which comprises the semiconductor wafer carrier according to any one of the first to fifth aspects, and a semiconductor wafer carrier automatic transfer device which transfers the semiconductor wafer carrier and adjusts an operational parameter based on a result of measurement.

According to a seventh aspect of the present invention, there is provided the semiconductor wafer carrier automatic transfer system according to the sixth aspect, wherein there are a plurality of semiconductor wafer carrier automatic transfer devices, and an operational parameter of a semiconductor wafer carrier is automatically adjusted while the semiconductor wafer carrier is automatically transferred.

According to an eighth aspect of the present invention, there is provided the semiconductor wafer carrier automatic transfer system according to the seventh or eighth aspect, wherein a host computer is provided to control the transfer of all semiconductor wafer carriers; to transfer automatically the semiconductor wafer carriers, and to adjust automatically the operational parameter.

According to a ninth aspect, there is provided the semiconductor wafer carrier automatic transfer system according to the eighth aspect, wherein the display section of the semiconductor wafer carriers produces an alarm to notice the necessity of a maintenance work when a result of measurement conducted during the transfer does not satisfy the threshold value.

According to a tenth aspect of the present invention, there is provided a method for producing a semiconductor device characterized by using the semiconductor wafer carrier automatic transfer system described in any one of the sixth to ninth aspects.

BRIEF DESCRIPTION OF THE DRAWINGS

A more complete appreciation of the invention and many of the attendant advantages thereof will be readily obtained as the same becomes better understood by reference to the following detailed description when considered in connection with the accompanied drawings, wherein.

DETAILED DESCRIPTION OF THE PREFERRED EMBODIMENTS

Preferred embodiments of the present invention will be described in detail with reference to the drawings.

Embodiment 1

Figure 1:
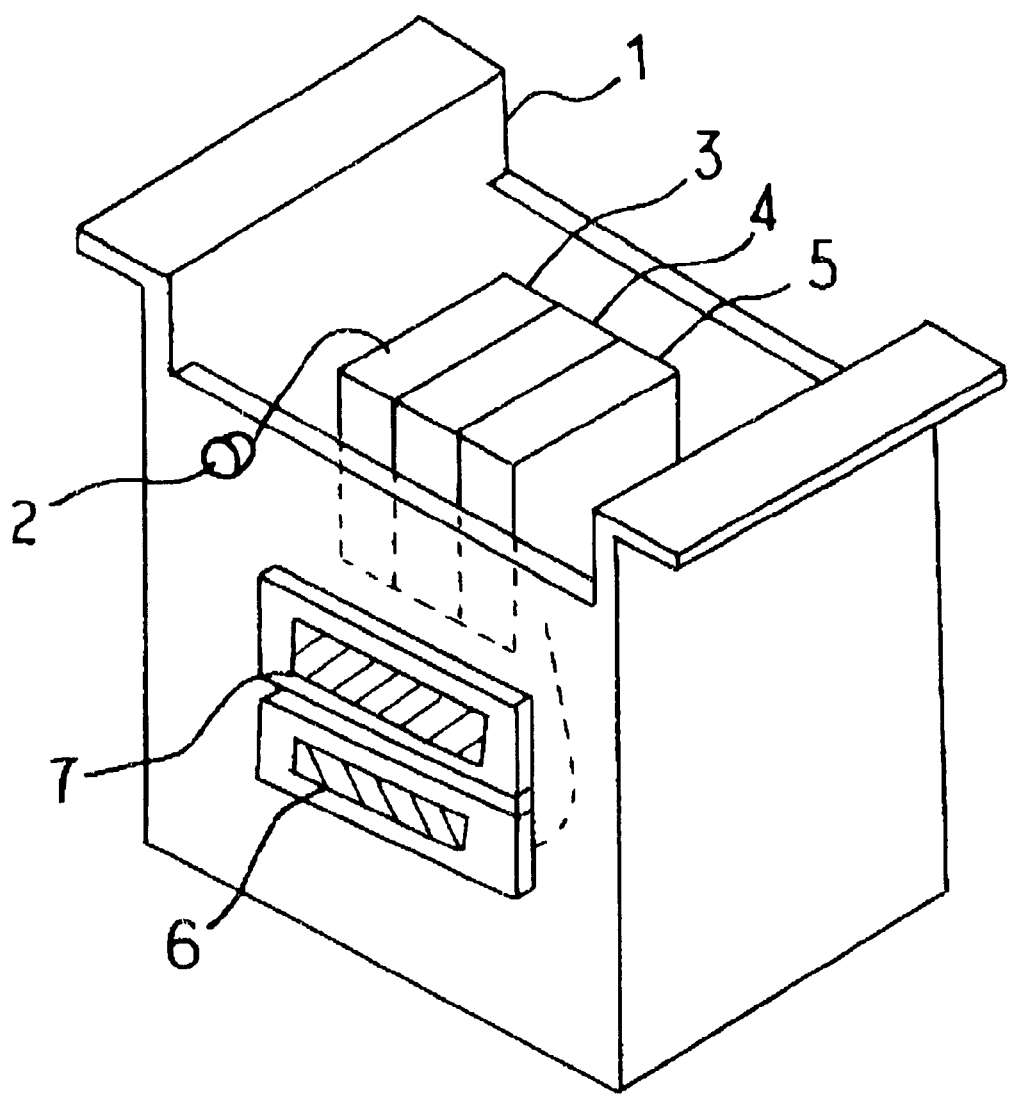
FIG. 1 is a perspective view of the semiconductor wafer carrier according to Embodiment 1 of the present invention.

FIG. 1 is a perspective view showing a semiconductor wafer carrier according to Embodiment 1 of the present invention. In FIG. 1, reference numeral 1 designates a semiconductor wafer carrier main body; numeral 2 a probe for measuring; numeral 3 a measuring section for measuring a measurement item; numeral 4 a computing section which stores data measured by the measuring section 3, calculates the data to obtain a result of measurement and compares the result with a threshold value prepared previously with respect to the measurement item, and numeral 5 a control section which provides an instruction to the measuring section 3 to start a measuring operation; makes a display section 6 display a result of measurement obtained by calculation in the computing section 4 and a result of comparison, and performs the exchange of data to an outer device such as a transfer device by means of a communicating section 7.

Figure 2:
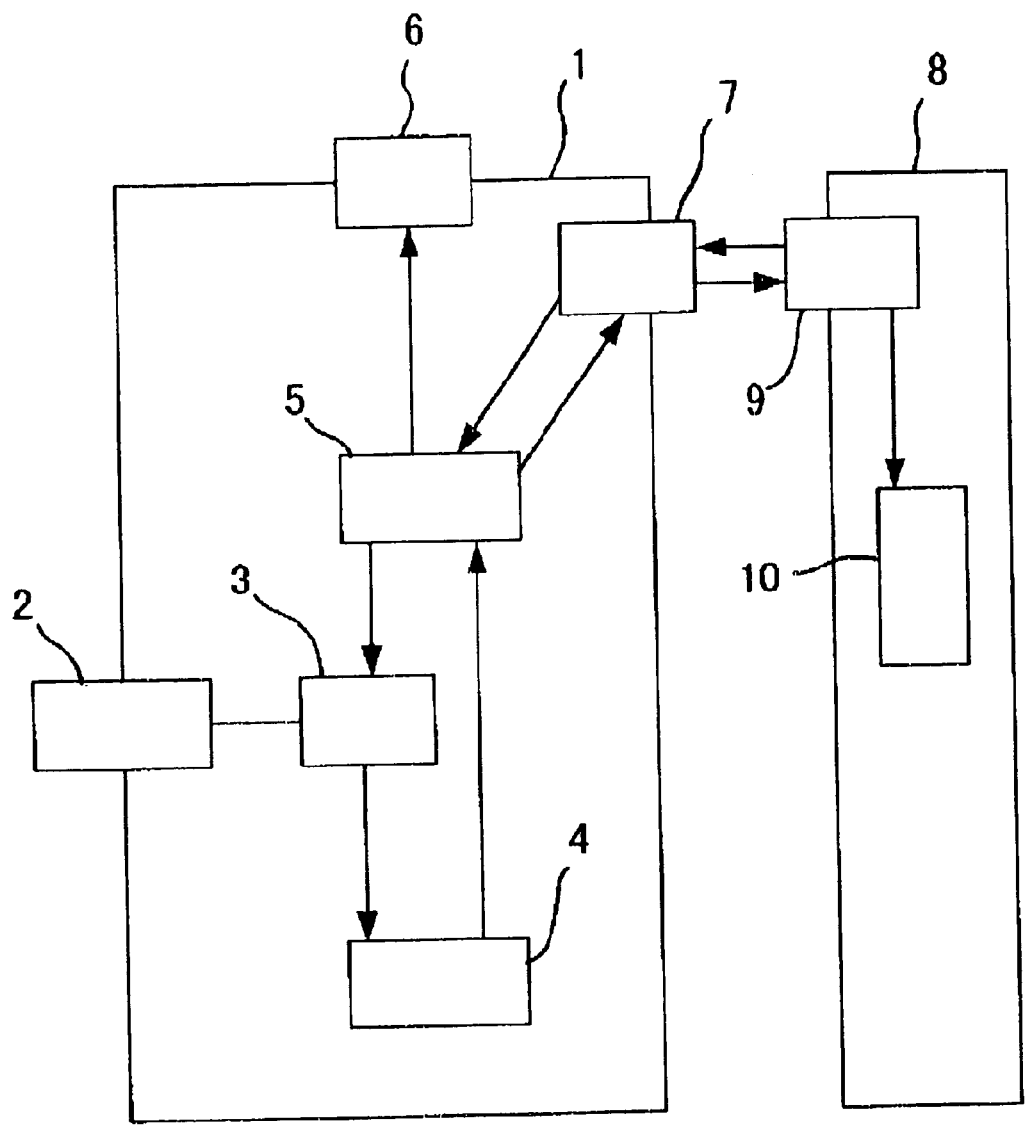
FIG. 2 is a block diagram showing a construction of each of the semiconductor wafer carrier and an automatic transfer device according to Embodiment 1.

FIG. 2 is a block diagram showing the inside of the semiconductor wafer carrier and a semiconductor wafer carrier automatic transfer device according to Embodiment 1. In FIG. 2, reference numeral 8 designates a semiconductor wafer carrier automatic transfer device which includes a communicating section 8 similar to the before-mentioned communicating section 7 and is controlled by a control section 10 to perform prescribed action.

Operations will be described.

A measurement starting instruction is supplied from the semiconductor wafer carrier automatic transfer device 8 through the communicating section 9 to a semiconductor wafer carrier. The measurement starting instruction is transmitted to the control section 5 through the communicating section 7 whereby the control section 5 gives a measurement starting instruction to the measuring section 3.

A measurement finishing instruction is supplied from the semiconductor wafer carrier automatic transfer device 8 through the communicating section 9 to the semiconductor wafer carrier. The measurement finishing instruction is transmitted to the control section 5 through the communicating section 7 whereby the control section 5 gives a measurement finishing instruction to the measuring section 3. During the measurement, measurement data are stored in the computing section 4, and the computing section calculates the data sequentially. The computing section 4, when the measurement is finished, supplies a result of measurement and a result of comparison to the control section 5. The control section 5 controls so that the result of measurement and the result of comparison are displayed on the display section 6. The control section 5 also supplies the result of measurement and the result of comparison to the semiconductor wafer carrier automatic transfer device 8 through the communicating section 7.

The semiconductor wafer carrier automatic transfer device 8 holds the results in the control section 10 in which an operational parameter is adjusted.

Figure 3:
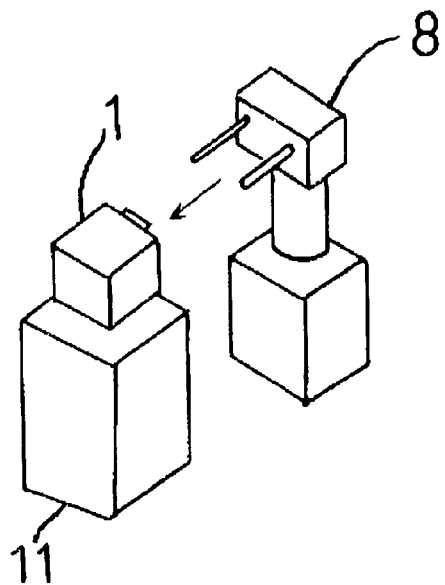
FIG. 3 is a perspective view of the semiconductor wafer carrier and the automatic transfer device according to Embodiment 1.
Figure 4:
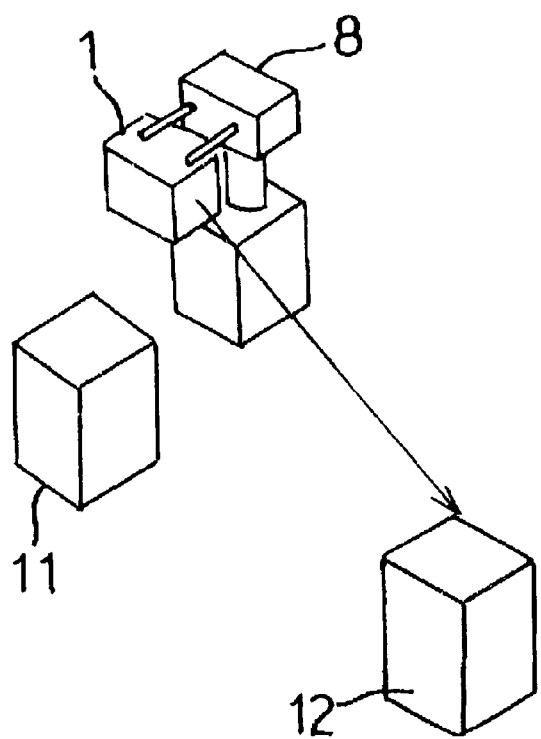
FIG. 4 is a perspective view of the semiconductor wafer carrier and the automatic transfer device according to Embodiment 1.
Figure 5:
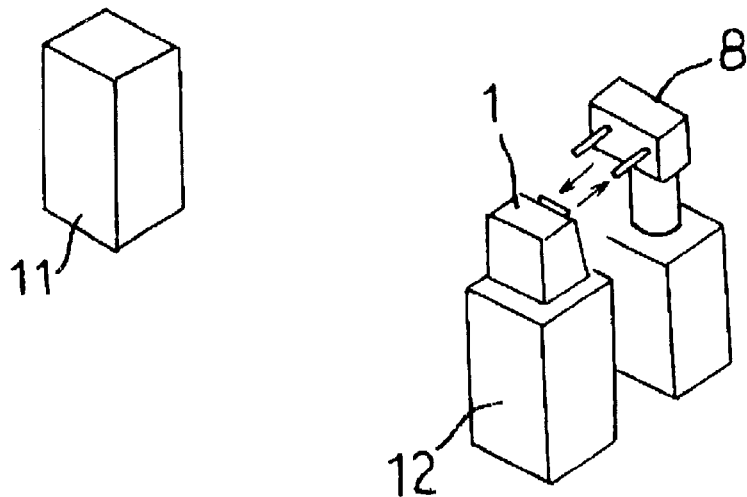
FIG. 5 is a perspective view of the semiconductor wafer carrier and the automatic transfer device according to Embodiment 1.

FIGS. 3 to 5 are perspective views showing the semiconductor wafer carrier main body 1 and the semiconductor wafer carrier automatic transfer device 8 according to Embodiment 1. In FIGS. 3 to 5, reference numeral 8 designates the above-mentioned semiconductor wafer carrier automatic transfer device 8 and numerals 11 and 12 designate stands on which the semiconductor wafer carrier main body is placed. The semiconductor wafer carrier automatic transfer device 8 transfers the semiconductor wafer carrier main body 1 from the stand 11 to the stand 12.

In FIG. 3, the semiconductor wafer carrier automatic transfer device 8 transmits, before the initiation of transfer, a signal to start measuring operations to the semiconductor wafer carrier main body 1. Then, the semiconductor wafer carrier main body 1 starts measuring operations.

Then, in FIG. 4, the semiconductor wafer carrier automatic transfer device 8 transfers the semiconductor lo wafer carrier main body 1. Further, in FIG. 5, the semiconductor wafer carrier automatic transfer device 8 puts the semiconductor wafer carrier main body 1 on the stand 12 and then, it transmits a measurement finishing instruction to the semiconductor wafer carrier main body 1.

The semiconductor wafer carrier main body 1 calculates measurement data to obtain a result of measurement and compares the result of measurement with a threshold value on a measurement item to obtain a result of comparison. The result of comparison is transmitted to the semiconductor wafer carrier automatic transfer device 8, and the result is displayed on the display device 6 in the semiconductor wafer carrier main body 1. The semiconductor wafer carrier automatic transfer device 8 changes for itself an operational parameter based on the result of comparison transmitted from the semiconductor wafer carrier main body 1.

For example, when the measurement item is velocity and when a result of measurement is larger than a predetermined threshold value, the semiconductor wafer carrier automatic transfer device 8 changes a parameter of speed so that the result of measurement falls in a range of the threshold value.

When the measurement item is an impact value and when a result of measurement is larger than a predetermined threshold value, the semiconductor wafer carrier automatic transfer device 8 changes data of transfer position by reducing or increasing the velocity of the semiconductor wafer carrier during a transferring movement so that the result of measurement falls in a range of the threshold value.

When the measurement item is time and when a result of measurement is longer than a predetermined threshold value, the semiconductor wafer carrier automatic transfer device 8 changes a parameter of moving speed or acceleration so that the result of measurement falls in a range of the threshold value.

When the measurement item is a component of ambience and when a result of measurement is larger than a predetermined threshold value, the semiconductor wafer carrier automatic transfer device 8 (in this case, a semiconductor wafer carrier storage device) changes an amount of gas supplied into a storage container so that a concentration of gas filled in the container is changed.

In the next, description will be made about a semiconductor wafer carrier automatic transfer system utilizing the above-mentioned semiconductor wafer carrier automatic transfer device 8 with reference to the drawings.

Figure 6:
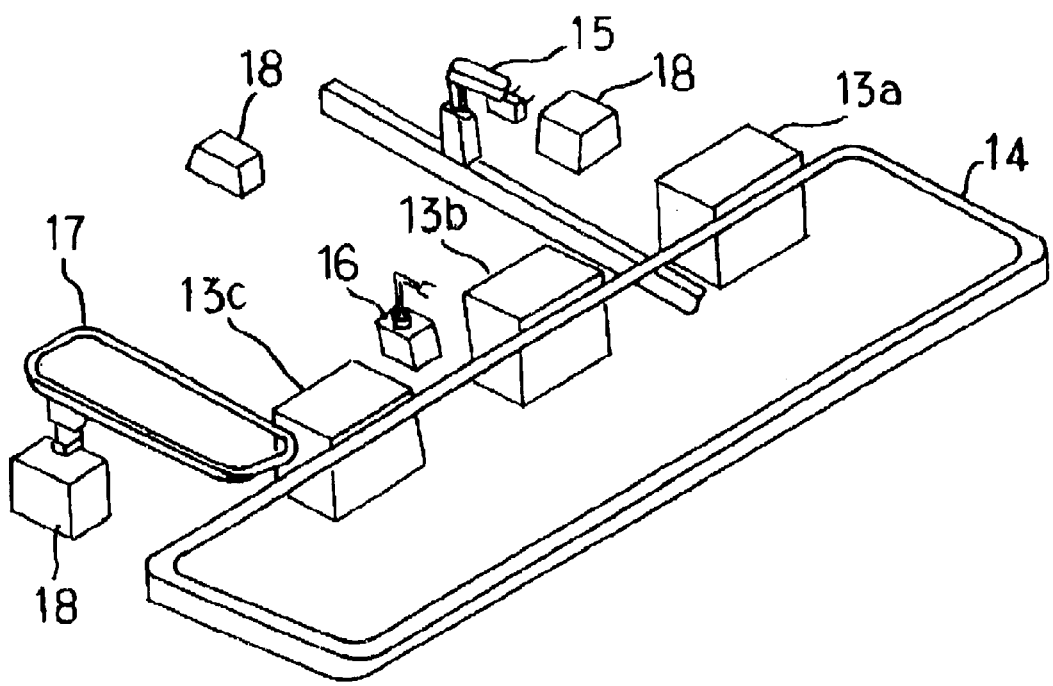
FIG. 6 is a perspective view of a semiconductor wafer carrier automatic transfer system according to Embodiment 1.

FIG. 6 is a generalized perspective view of a semiconductor wafer carrier automatic transfer system introduced in a wafer processing line. In FIG. 6, reference numerals 13a to 13c designate stockers adapted to hold the wafer carrier main body 1, numeral 14 designates an overhead traveling carrier for transferring the semiconductor wafer carrier main body 1 among the stockers 13a–13c, numerals 15, 16 and 17 designate transfer robots each transferring the semiconductor wafer carrier main body 1 between each stocker 13a, 13b or 13c and each manufacturing device 18.

The stockers 13a–13c, the overhead traveling carrier 14 and the transfer robots 15,16,17, as devices for transferring automatically the semiconductor wafer carrier, have the same function as the semiconductor wafer carrier automatic transfer device 8 described before.

Figure 7:
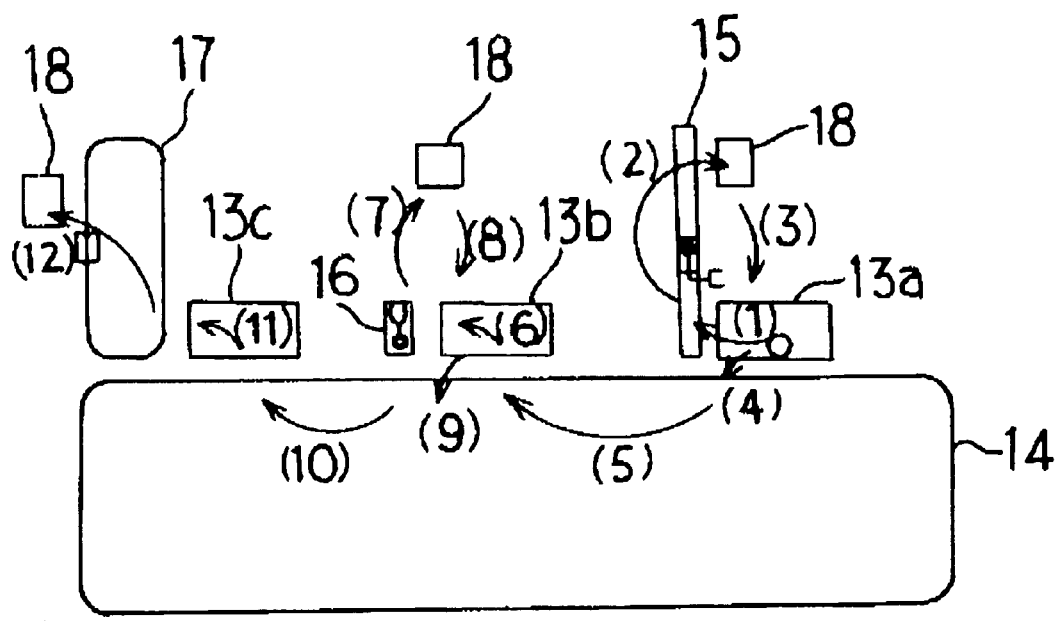
FIG. 7 is a plan view showing operations of the semiconductor wafer carrier automatic transfer system according to Embodiment 1.

Operations will be described with reference to FIG. 7.

In movement (1), the semiconductor wafer carrier main body 1 is transferred by the stocker 13a, and each parameter of the stocker 13a is adjusted in the manner as described with reference to FIG. 5.

In movement (2), the semiconductor wafer carrier main body 1 which has been transferred from the stocker 13a is transferred with the transfer robot 15 and each parameter of the transfer robot 15 is adjusted in the manner as described with reference to FIG. 5.

Further, in movements (3) and (4), the semiconductor wafer carrier main body 1 is carried onto the overhead traveling carrier 14. In movement (5), the semiconductor wafer carrier main body 1 is transferred from the stocker 13a to the stocker 13b by means of the overhead traveling carrier 14 and each parameter of the overhead traveling carrier 14 is adjusted in the manner as described with reference to FIG. 5.

In movements (6) to (12), each parameter of each device (i.e., the stockers 13b, 13c and the transfer robots 16, 17) is adjusted in the same way as conducted in the movements (1)–(5).

Thus, by traveling the semiconductor wafer carrier main body 1 around each device by using the semiconductor wafer carrier automatic transfer system shown in FIG. 6, all the structural elements of the semiconductor wafer carrier automatic transfer system can automatically be adjusted whereby a time for setting-up the system can be shortened as well as saving man power. Further, all the structural elements constituting the system can uniformly be adjusted without any difference among the structural elements because the adjustment is made with the same standard by using a single semiconductor wafer carrier.

Embodiment 2

Figure 8:
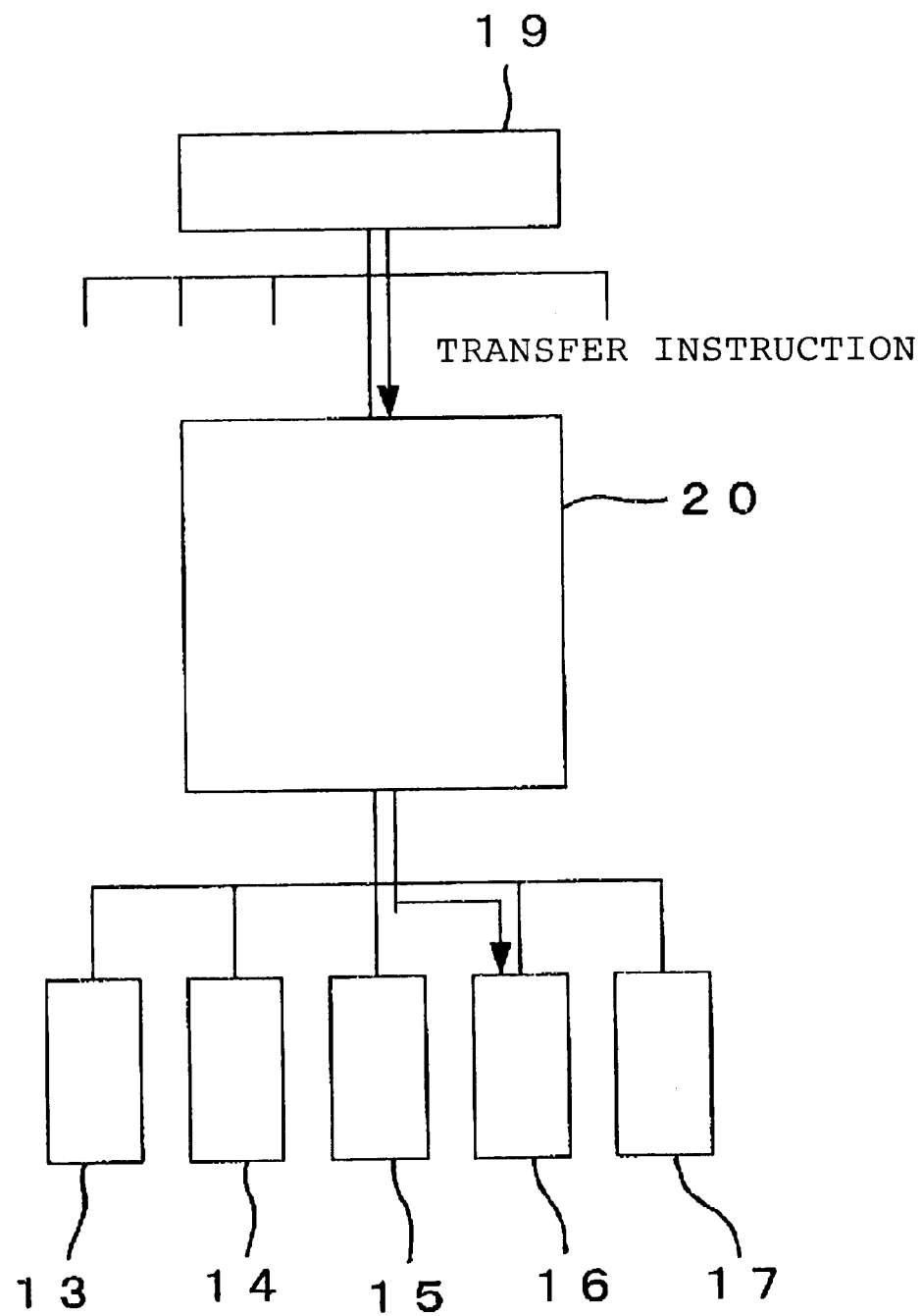
FIG. 8 is a systematic diagram showing the semiconductor wafer carrier automatic transfer system according to Embodiment 2.

FIG. 8 is a systematic diagram showing the semiconductor wafer carrier automatic transfer system according to Embodiment 2 of the present invention.

In FIG. 8, reference numeral 19 designates a host computer which administrates all semiconductor wafer carriers working in a wafer processing line and generates to a carrier automatic transfer system controller 20 a transfer instruction of, for example, "Transfer a specified semiconductor wafer carrier from where to where". When the controller 20 receives the instruction, it operates the semiconductor wafer carrier automatic transfer devices 13–17 to transfer the specified wafer carrier to a specified location.

Figure 9:
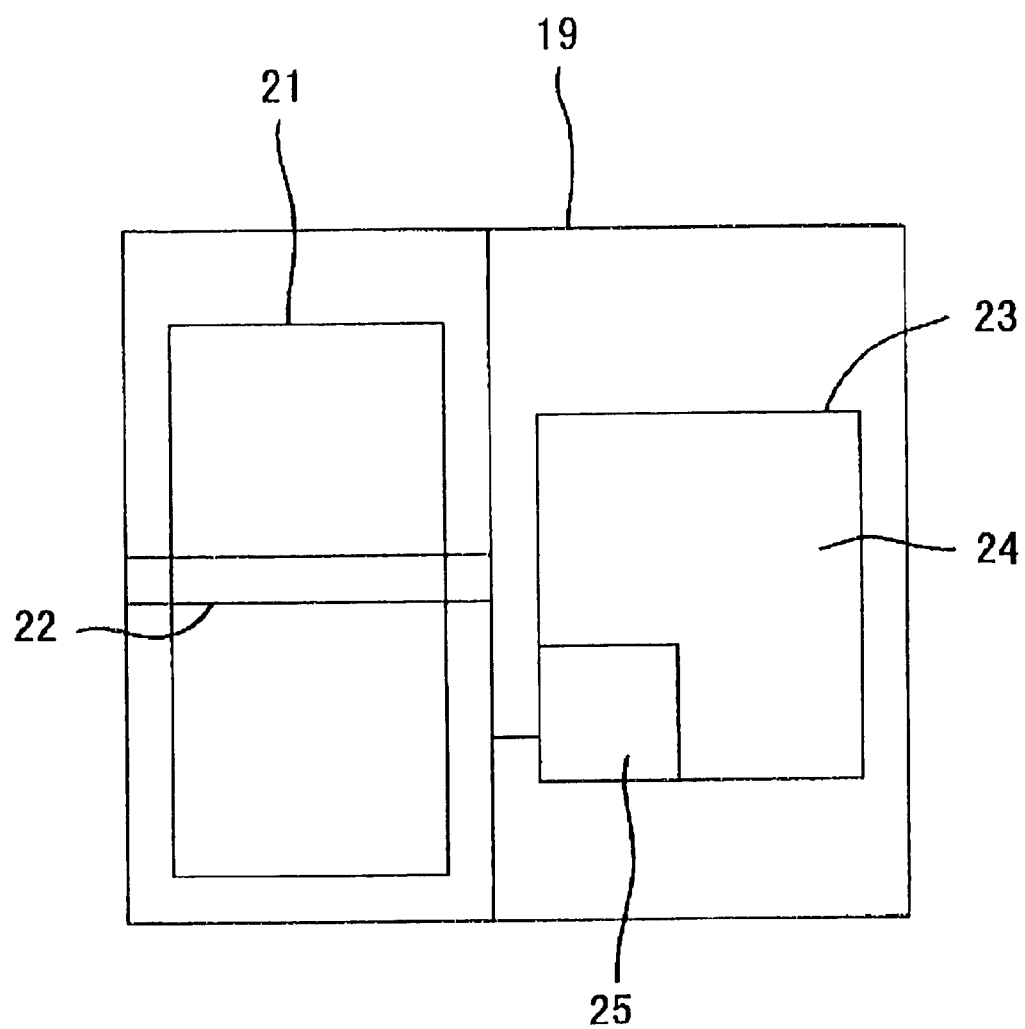
FIG. 9 is a diagram showing the inside of a host computer.

FIG. 9 is a diagram showing the inside of the host computer 19. The host computer 19 has a table 21 concerning the work of all semiconductor wafer carriers in the processing line. The table 21 holds data 22 on the working of each of the semiconductor wafer carriers. Reference numeral 23 designates a physical distribution control section for controlling the movement of the semiconductor wafer carriers, which is composed of a physical distribution control section 24 for a product carrier which holds semiconductor wafers and a physical distribution control section 25 for generating an instruction to move the semiconductor wafer carriers.

Operations will be described.

The physical distribution control section 23 generates regularly or irregularly to the physical distribution control section 25 an instruction to generate an instruction to move the semiconductor wafer carriers. The physical distribution control section 25, when receives the instruction, generates a transfer instruction to the carrier automatic transfer system controller 20.

Then, the carrier automatic transfer system controller 20 operates each of the semiconductor wafer carrier automatic transfer devices 13–17 to move the semiconductor wafer carrier.

While the semiconductor wafer carrier is transferred, adjustment of each parameter is made in each of the semiconductor wafer carrier automatic transfer devices 13–17 according to the way as described with reference to FIG. 5.

In Embodiment 2, the semiconductor wafer carrier automatic transfer system in work can provide a stable operation, and it is possible to omit operations by workers for maintenance, hence, to save man power.

Further, the maintenance work can be conducted automatically. Accordingly, it is unnecessary to stop the system or the devices in order to conduct the maintenance, and there is little possibility of lowering productivity.

Embodiment 3

The construction of the semiconductor wafer carrier automatic system according to Embodiment 3 of the present invention is substantially the same as that shown in FIG. 8, and accordingly, description of the construction is omitted, and only operations will be described.

The physical distribution control section 23 generates regularly or irregularly to the physical distribution control section 25 an instruction to generate an instruction to move the semiconductor wafer carriers. The physical distribution control section 25, when receives the instruction, generates an instruction of transfer to the carrier automatic transfer system controller 20.

Then, the carrier automatic transfer system controller 20 operates each of the semiconductor wafer carrier automatic transfer devices 13–17 to move the semiconductor wafer carrier.

During the transferring operations, the semiconductor wafer carrier compares a result of measurement and a predetermined threshold value to obtain a result of comparison and displays the result of comparison on the display section 6.

If the measured value does not satisfy the threshold value, the display section 6 generates an alarm to the operator to suggest a maintenance work.

The operator can understand the content of a maintenance work in view of a displayed result of comparison on the display section 6 and conducts an appropriate treatment, whereby the semiconductor wafer carrier automatic transfer system can be operated in a stable manner.

Embodiment 4

Further, it is also possible to produce actually semiconductor devices by using the semiconductor wafer carrier automatic transfer system according to Embodiments 1 to 3. Namely. The semiconductor wafer carrier automatic transfer system can be used for producing semiconductor devices.

According to the first to fifth aspects of the present invention, adjustment of devices in a semiconductor wafer carrier automatic transfer system can automatically be done.

According to the sixth aspect of the present invention, the structural elements of the system can uniformly be adjusted without any difference among the structural elements because the adjustment is made with the same standard by using a single semiconductor wafer carrier.

According to the seventh aspect of the present invention, all the structural elements constituting the system can uniformly be adjusted whereby a time for setting-up the system can be shortened as well as saving man power.

According to the eighth aspect of the present invention, a stable operation is always assured, and it is possible to save man power, hence, saving manpower.

According to the ninth aspect of the present invention, the system can always be operated in a stable manner.

According to the tenth aspect of the present invention, semiconductor devices can effectively be manufactured.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 12-004443 filed on Jan. 13, 2000 and Japanese Patent Application No. 12-159525 filed on May 30, 2000 including specification, claims, drawings and summary are incorporated herein by reference in its entirety.

What is claimed is:

1. A semiconductor wafer carrier which comprises a measuring section for measuring a measurement item, a computing section having functions to calculate a result of measurement based on measured data and to compare the result with a threshold value of the measurement item, a display section for displaying a result of comparison and a result of measurement and a communicating section for conducting communication with an outer device.

2. The semiconductor wafer carrier according to claim 1, wherein the measurement item is velocity.

3. The semiconductor wafer carrier according to claim 1, wherein the measurement item is an impact value.

4. The semiconductor wafer carrier according to claim 1, wherein the measurement item is time.

5. The semiconductor wafer carrier according to claim 1, wherein the measurement item is a component of ambience.

6. A semiconductor wafer carrier automatic transfer system which comprises the semiconductor wafer carrier according to claim 1, and a semiconductor wafer carrier automatic transfer device which transfers the semiconductor wafer carrier and adjusts an operational parameter based on a result of measurement.

7. The semiconductor wafer carrier automatic transfer system according to claim 6, wherein there are a plurality of semiconductor wafer carrier automatic transfer devices, and the operational parameter of a semiconductor wafer carrier is automatically adjusted while the semiconductor wafer carrier is automatically transferred.

8. The semiconductor wafer carrier automatic transfer system according to claim 6, wherein a host computer is provided to control the transfer of all semiconductor wafer carriers; to transfer automatically the semiconductor wafer carriers, and to adjust automatically the operational parameter.

9. The semiconductor wafer carrier automatic transfer system according to claim 8, wherein the display section of the semiconductor wafer carriers produces an alarm to notice the necessity of a maintenance work when a result of measurement conducted during the transfer does not satisfy the threshold value.

10. A method for producing a semiconductor device characterized by using the semiconductor wafer carrier automatic transfer system described in claim 6.

* * * * *